(12) United States Patent
Choquette

(10) Patent No.: US 6,708,645 B1
(45) Date of Patent: Mar. 23, 2004

(54) ARC RESISTANT HIGH VOLTAGE FEEDTHRU FITTING FOR A VACUUM DEPOSITION CHAMBER

(75) Inventor: Robert W. Choquette, Sarasota, FL (US)

(73) Assignee: CompuVac Systems, Inc., Sarasota, FL (US)

(*) Notice: Subject to any disclaimer, the term of this patent is extended or adjusted under 35 U.S.C. 154(b) by 21 days.

(21) Appl. No.: 10/121,812

(22) Filed: Apr. 12, 2002

(51) Int. Cl.$^7$ ............................................. C23C 16/00
(52) U.S. Cl. ...................... 118/723 R; 118/723 VE; 118/723 HC; 118/723 E; 118/726
(58) Field of Search .................. 118/723 R, 723 VE, 118/723 HC, 723 EB, 723 MP, 723 DC, 723 E; 156/345.1, 345.43, 345.44, 345.47; 204/298.08, 298.34, 298.41

(56) References Cited

U.S. PATENT DOCUMENTS

| | | | |
|---|---|---|---|
| 4,657,616 A | * 4/1987 | Benzing et al. | 156/345.43 |
| 5,556,506 A | * 9/1996 | Contreras et al. | 438/584 |
| 5,895,531 A | 4/1999 | Vignola | |
| 5,970,908 A | 10/1999 | Glanz | |
| 6,021,738 A | * 2/2000 | Glanz | 118/723 R |

* cited by examiner

*Primary Examiner*—Luz Alejandro-Mulero
(74) *Attorney, Agent, or Firm*—Charle J. Prescott

(57) ABSTRACT

In an apparatus for initial ion cleaning, vapor metal deposition and protective coating of objects by vacuum deposition, an improved high voltage high current feedthru fitting with improved anti-fouling arc-resistant characteristics. The apparatus includes a vacuum chamber for receiving the objects which are held on a movable rack or support. A metal such as aluminum is vaporized centrally in the chamber in a well known fashion after the chamber has been substantially evacuated of air molecules for uniform vapor deposition of the metal atop exposed surfaces of the objects. The improved feedthru fitting is connected through a wall of an elongated housing which is connected over an elongated opening formed through a chamber side wall. An elongated conductive preferably aluminum rod is disposed within the housing along the opening into the chamber interior generally coextensive with two apertured delivery tubes or members positioned within the housing. The conductive rod is electrically isolated from the housing and chamber and connected to a d.c. or a.c. high voltage power source as a cathode by one or more improved feedthru fittings to produce plasma during ion cleaning and when applying the protective monomer coating.

5 Claims, 9 Drawing Sheets

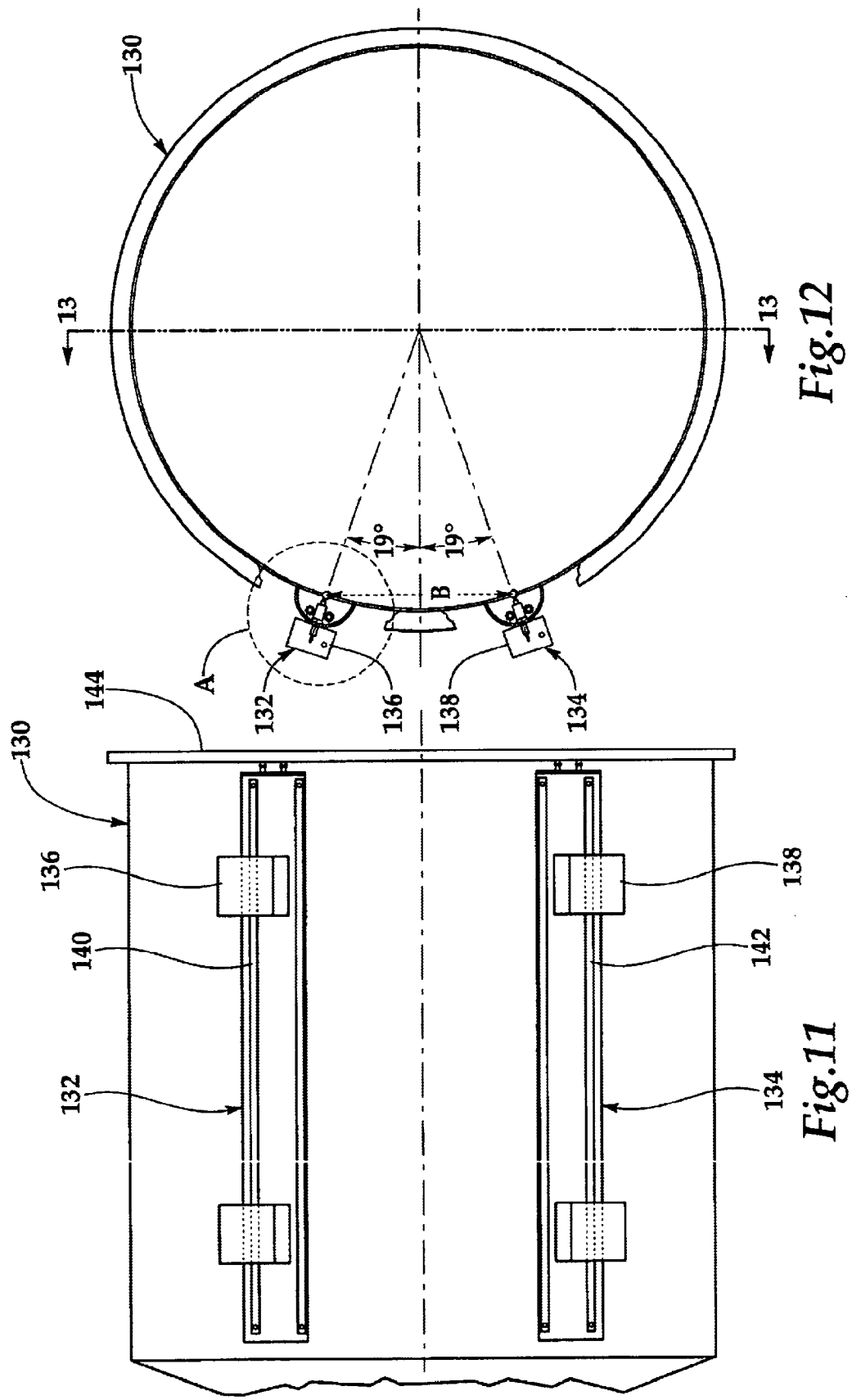

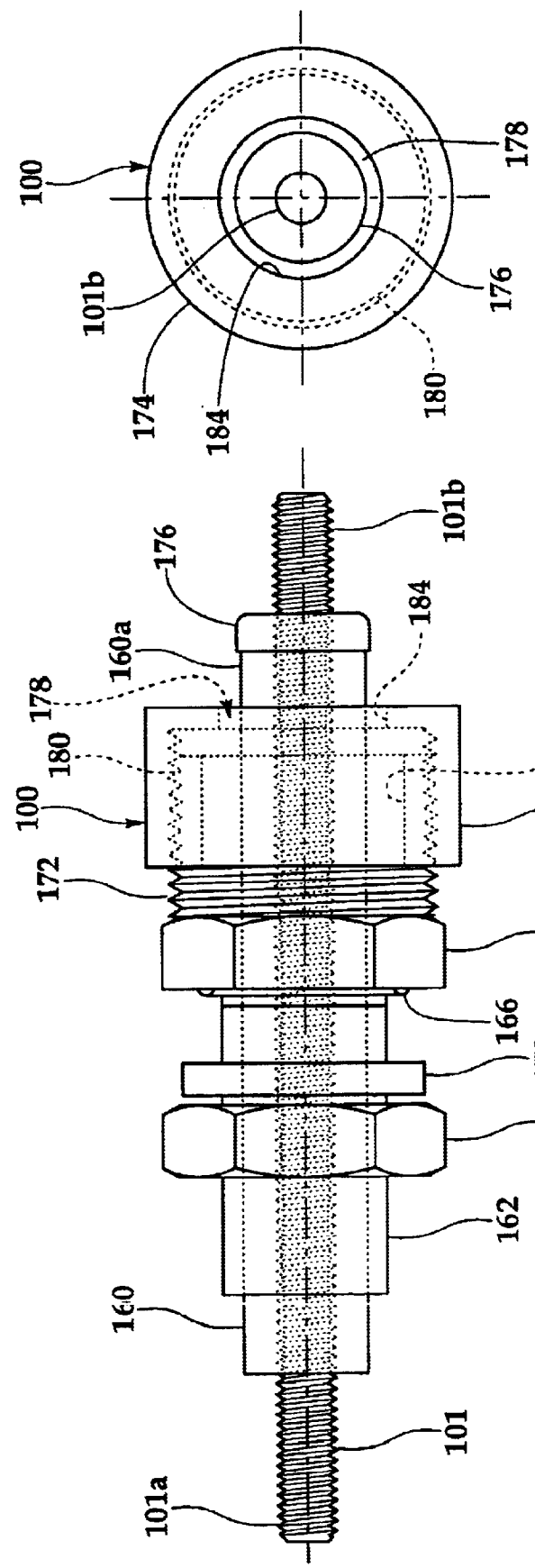

ARC RESISTANT HIGH VOLTAGE FEEDTHRU FITTING FOR A VACUUM DEPOSITION CHAMBER

BACKGROUND OF THE INVENTION

1. Scope of Invention

This invention relates generally to systems for coating objects by vacuum deposition, and more particularly to an improved anti-fouling or arc-resistant feedthru fitting for transferring necessary high voltage and current into a plasma-producing conductive rod in the vacuum deposition chamber.

2. Prior Art

Vacuum deposition of vaporized metal and plasma-energized protective coatings onto the exterior and interior surfaces of objects such as plastic components for automobile manufacturers which require a high degree of uniformity and finish quality are well known. One major manufacturer of such equipment is F. J. Stokes Corporation.

These prior art vacuum deposition systems typically include a medium to large sized vacuum chamber, a large moveable rack or carriage for holding and supporting a plurality of objects for coating within the chamber, means for conveniently moving the loaded object support carriage into and out of the chamber, an arrangement for producing vaporized metal for depositing a first metallic layer of vaporized metal onto the surface of the objects and a source of vaporized protective liquid such as a monomer which is applied atop the vaporized metal first deposited onto the surfaces of the objects within the vacuum chamber.

The use of a plasma created within the vacuum chamber in the vicinity of the metal coated objects is also typically utilized to energize the vaporized liquid monomer and to accelerate the liquid monomer within the vacuum chamber to facilitate a uniform protective coating applied to the objects.

However, the support and transfer of high voltage and current components of current systems into the elongated conductive rod which produces the plasma in the vacuum chamber required for metal deposition also become coated with the same vaporized deposition material. The previous U.S. Pat. Nos. 5,895,531 and 5,970,908 were directed to eliminating the degradation of the conductive rod during periods of downtime when the vacuum in the chamber is removed to atmospheric conditions for loading and unloading of objects for metal deposition.

The build-up of conductive vaporized deposition material can accumulate on the non-conductive outer support shields which both support the conductive rods and deliver the necessary high voltage current into the rods to the point where arcing occurs between the inner elongated conductive core of the thru fitting and the conductive sides of the chamber. This requires removal and manual cleaning of the deposited metal onto the ceramic non-conductive surfaces of the thru fitting before it may be placed back into service.

A separate removable cover for the feedthru electrodes is currently used to completely shield the electrode but this requires a separate shut-down of the system in order to remove those covers during normal operation of the plasma deposition of vaporized metal.

BRIEF SUMMARY OF THE INVENTION

This invention is directed to an improved apparatus for initial ion cleaning, vapor metal deposition and protective coating of objects by vacuum deposition, the improvement including a high voltage, high current feedthru fitting with anti-fouling and arc-free characteristics. The apparatus includes a vacuum chamber for receiving the objects which are held on a movable rack or support. A metal such as aluminum is vaporized centrally in the chamber in a well known fashion after the chamber has been substantially evacuated of air molecules for uniform vapor deposition of the metal atop exposed surfaces of the objects. The improved feedthru fitting is connected through a wall of an elongated housing which is connected over an elongated opening formed through a chamber side wall. An elongated conductive preferably aluminum rod is disposed within the housing along the opening into the chamber interior generally coextensive with two apertured delivery tubes or members positioned within the housing. The conductive rod is electrically isolated from the housing and chamber and connected to a d.c. or a.c. high voltage power source as a cathode by one or more of the improved feedthru fittings to produce plasma during ion cleaning and when applying the protective monomer coating.

It is therefore an object of this invention to provide an improved apparatus for protectively coating vapor metalized coated objects within a vacuum chamber.

It is yet another object of this invention to provide a uniquely configured non-fouling arc-resistant high current high voltage feedthru fitting or electrode positioned within a side cavity through a hole in a wall area of the vacuum chamber for supporting the conductive plasma producing rod.

In accordance with these and other objects which will become apparent hereinafter, the instant invention will now be described with reference to the accompanying drawings.

BRIEF DESCRIPTION OF THE DRAWINGS

FIG. 11 is a side elevation schematic view of an improved embodiment of a vacuum chamber similar to that shown in FIGS. 1 and 2.

FIG. 12 is a front elevation simplified schematic view of the vacuum chamber of FIG. 11 and the polymerization guns thereof.

FIG. 15 is a side elevation view of an improved anti-fouling substantially arc-free feedthru fitting.

FIG. 16 is an end elevation view of FIG. 15.

DETAILED DESCRIPTION OF THE INVENTION

Figure 1:
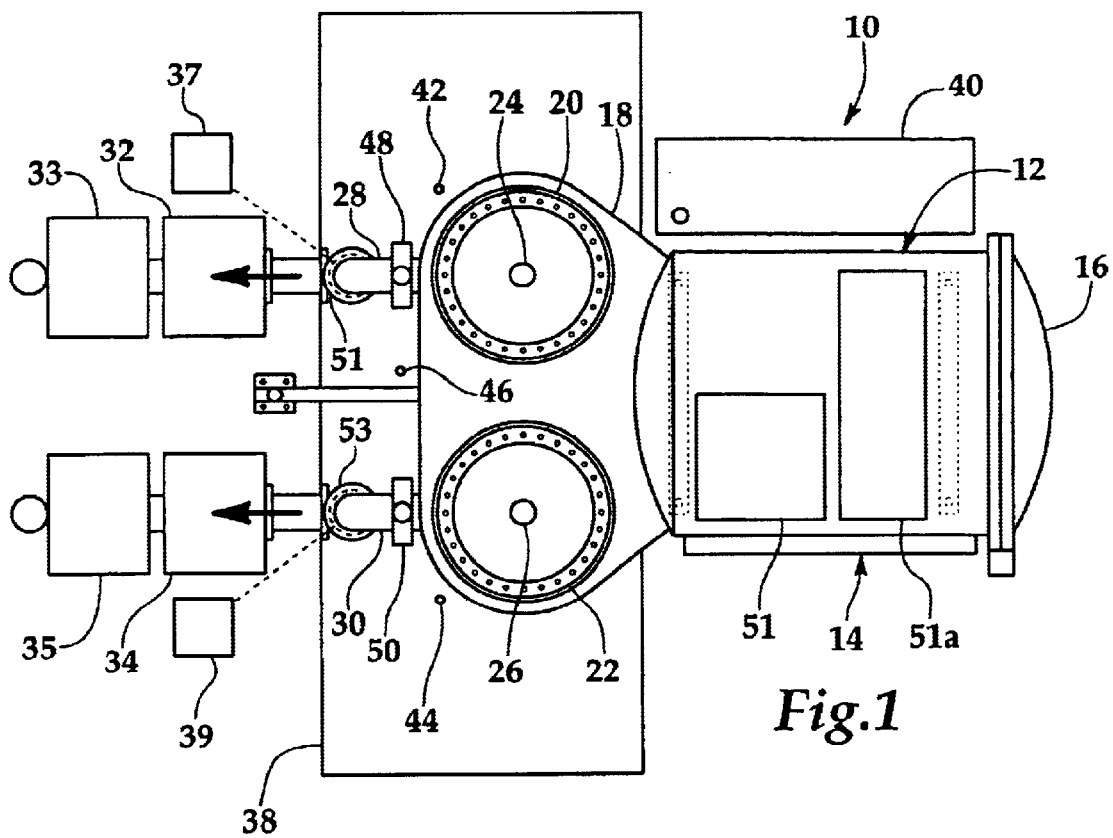
FIG. 1 is a top plan simplified schematic view of the entire apparatus of the present invention.
Figure 2:
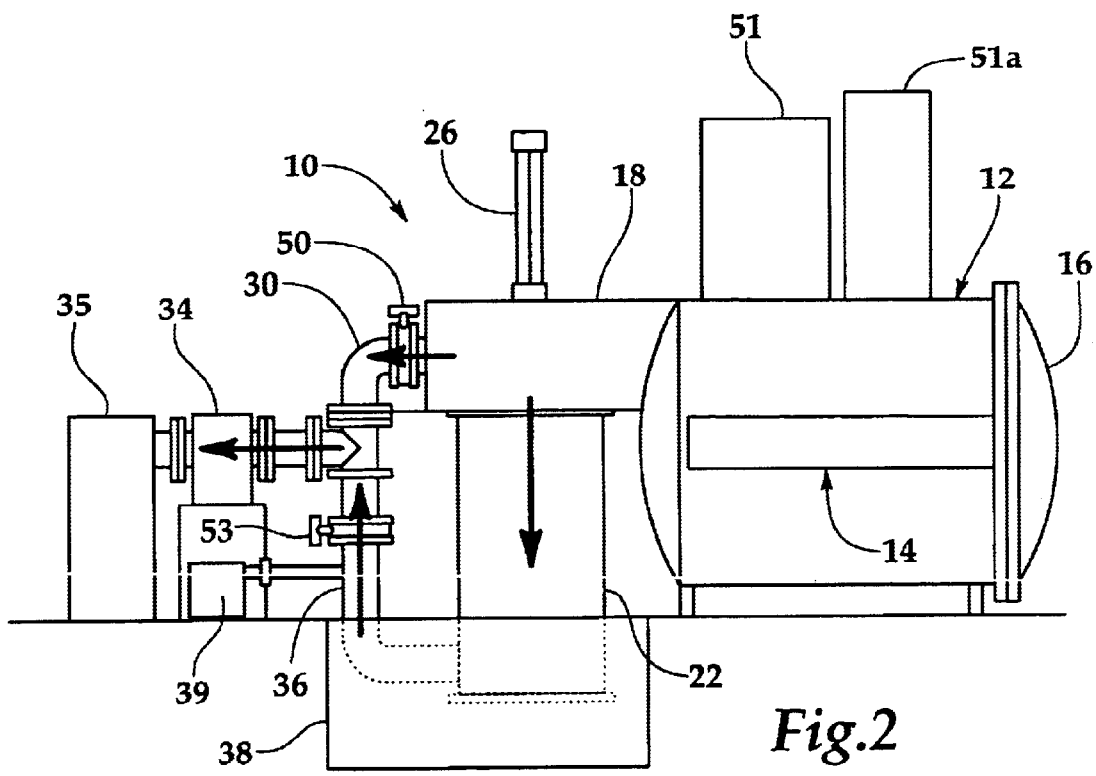
FIG. 2 is a side elevation view of FIG. 1.
Figure 3:
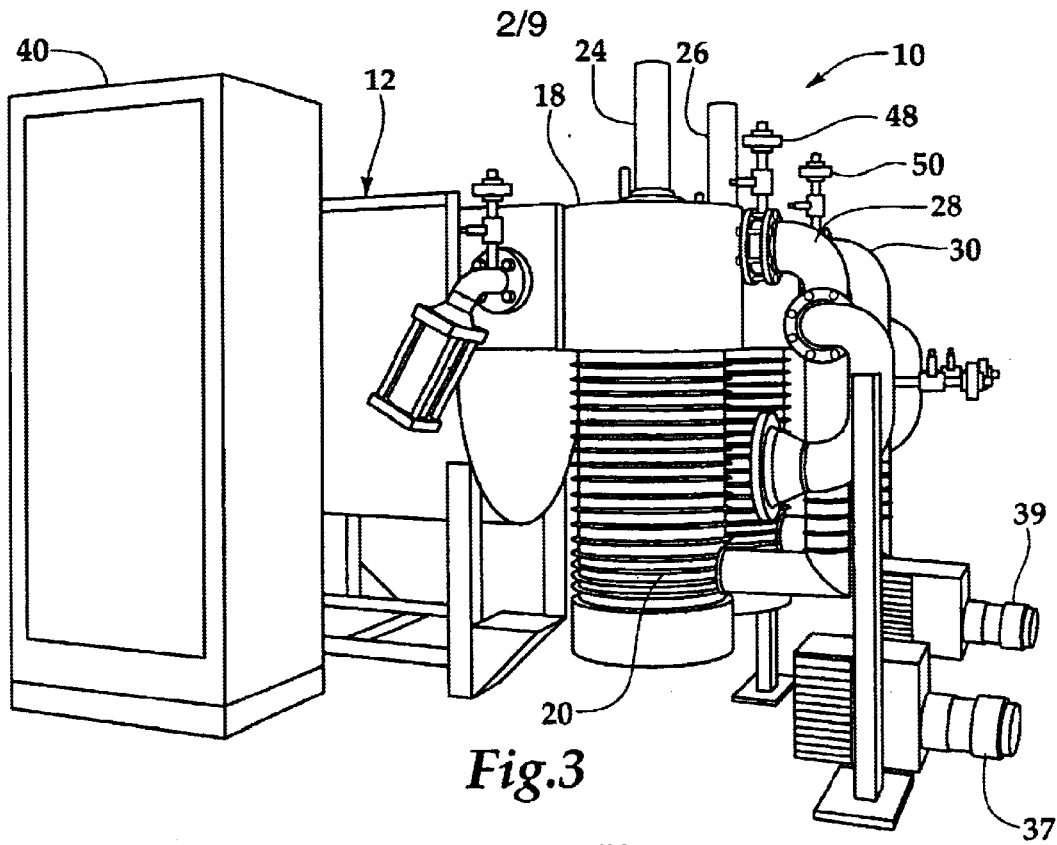
FIG. 3 is a perspective view of FIG. 1 absent some components for clarity.

Referring now to the drawings, and particularly to FIGS. 1 to 3, the improved apparatus of the present invention is shown generally at numeral 10 and includes a vacuum chamber 12 having a polymerization gun assembly 14 in accordance with the present invention attached to a side of the vacuum chamber 12. The system 10 also includes a plenum 18 which extends horizontally from one end of the vacuum chamber 12. The plenum 18 is connected above dual water cooled diffusion pumps 20 and 22, preferably the Varian NHS-35" diffusion pumps. Hi-Vac cylinders 24 and 26 serve to open the diffusion pumps 20 and 22 which generally serve as a second stage of vacuum chamber 12 drawdown. Water coolant into the system is connected at 42 and 44, while an air supply for the system is connected at 46.

During the initial vacuum draw down stage, valves 48 and 50 are opened and the twin mechanical pumps 33 and 35 and blower pumps 32 and 34 provide a viscous flow for vacuum drawdown through manifolds 28 and 30. During the second stage of vacuum drawdown, valves 48 and 50 are closed and valves 51 and 53 are opened to allow the diffusion pumps 20 and 22 to provide molecular flow for final vacuum drawdown. The molecular flow produced by the diffusion pumps 20 and 22 flows through manifolds 36 discharging through pumps 33 and 35 and 32 and 34. A pit 38 is provided for receiving the lower portion of the diffusion pumps 20 and 22 so as to facilitate the horizontal orientation of the plenum chamber 18 for more advantageous evacuation of the vacuum chamber 12.

Holding pumps 37 and 39 are provided to protect the diffusion pumps 20 and 22 when the system 10 is open and idle. A polycold pump 51 by Polycold Systems International for evacuating water molecules from the vacuum chamber 12 is also provided. The firing transformer in housing 51a is required for vaporizing the sacrificial evaporant positioned in the center of the carriage (described herebelow). A control housing 40 contains the control circuitry and components required to sequentially operate the system 10.

Figure 4:
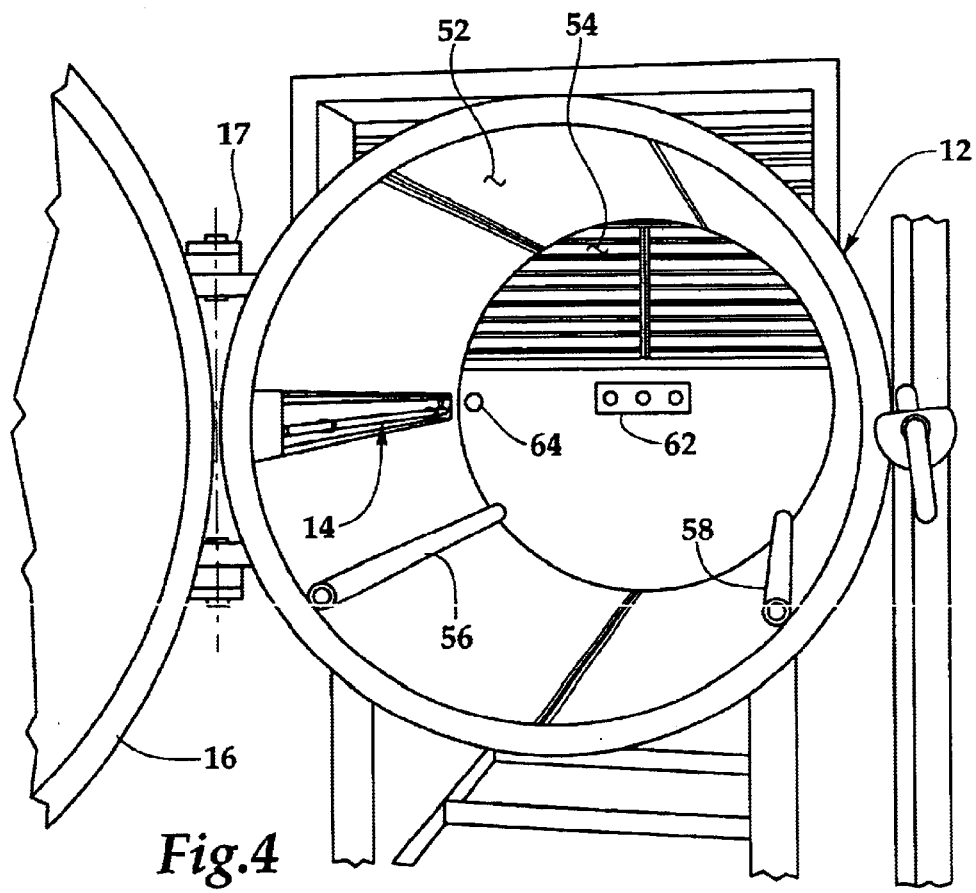
FIG. 4 is a perspective view of the vacuum chamber of FIG. 1 in an open, ready-to-load configuration.

Referring now to FIG. 4, many of the details of the vacuum chamber 12 are there shown and in subsequent figures described herebelow. The vacuum chamber 12 is generally constructed of mild steel having a diameter typically of 72" (but may range from 24", 48" to 72") and an overall chamber length of 82" (but may range from 36" to 104"). Panels of thin stainless steel shown typically at 52 line the inner cylindrical surface of the vacuum chamber 12 to prevent vaporized metal buildup and are easily replaceable for cleaning. The vacuum chamber 12 is evacuated through grill 54 which is in fluid communication with the plenum chamber 18 as previously described.

A mild steel dome-shaped door 16 pivotally connected at 17 to the one end of the vacuum chamber 12 is sealably closeable onto the open end of the vacuum chamber 12 and is also protectively covered by removable thin stainless steel panels and further includes one or two transparent viewing parts through which the vacuum deposition process may be observed.

Figure 5:
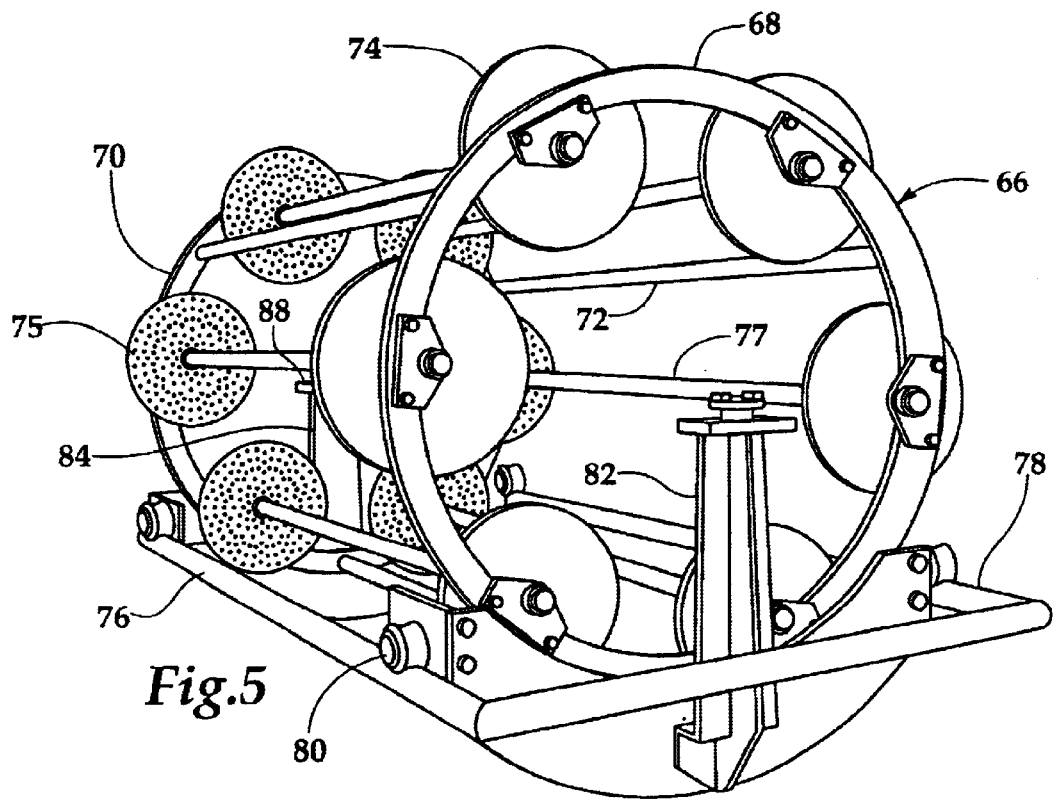
FIG. 5 is a perspective view of a planetary object support carriage for supporting objects to be loaded into and coated within the vacuum chamber.

The vacuum chamber 12 is adapted to include longitudinally extending parallel and generally horizontally oriented rails 56 and 58. These rails 56 and 58 are spaced apart and adapted to supportively rollably receive a carriage 66 as seen in FIG. 5. This carriage 66, including rollers 80 at each corner thereof rolling on support members 76 and 78 facilitate the easy deployment of the carriage 66 into and out of the vacuum chamber 12.

Figure 9:
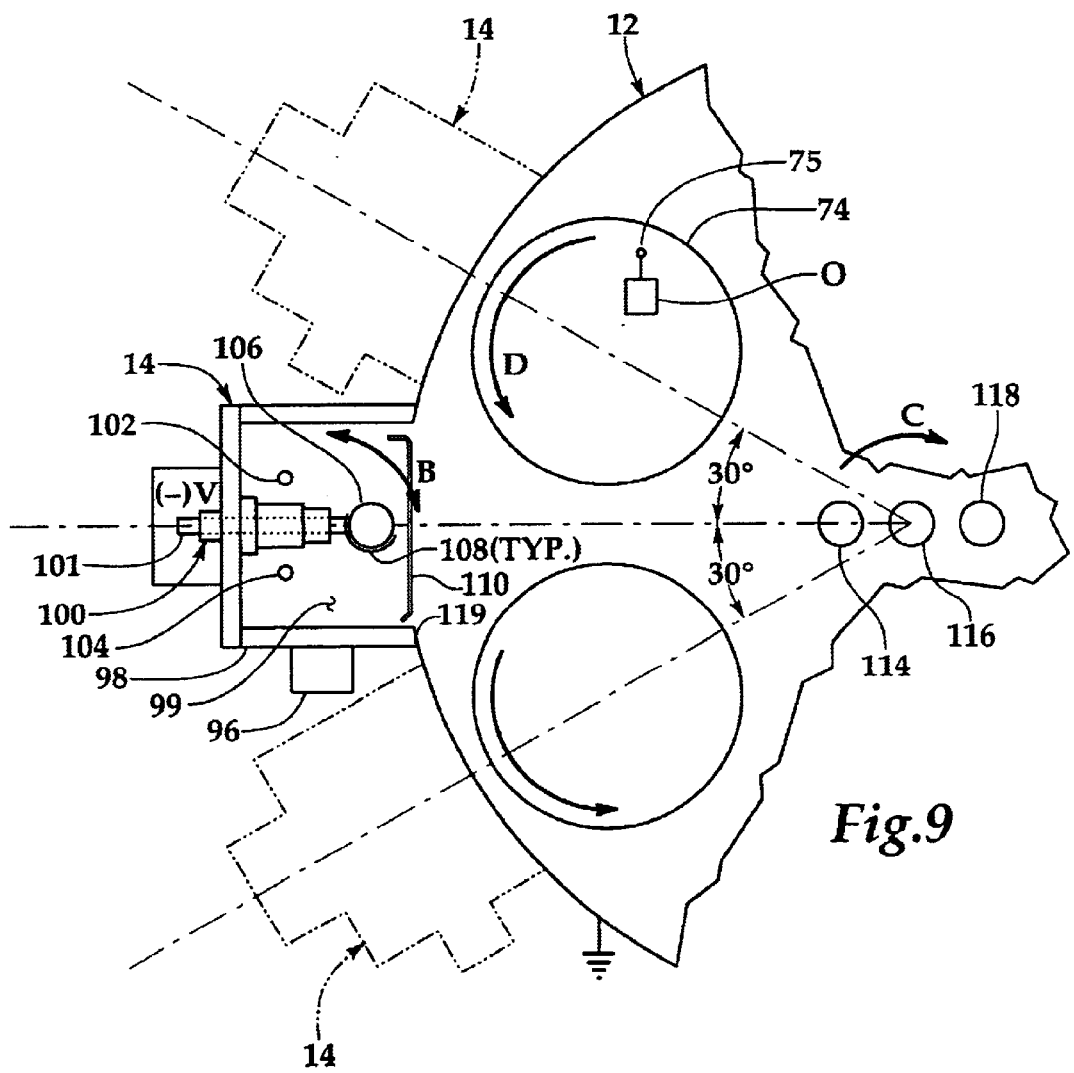
FIG. 9 is a front elevation simplified schematic view of the vacuum chamber and polymerization gun showing alternate positioning of a dual polymerization gun arrangement.
Figure 10:
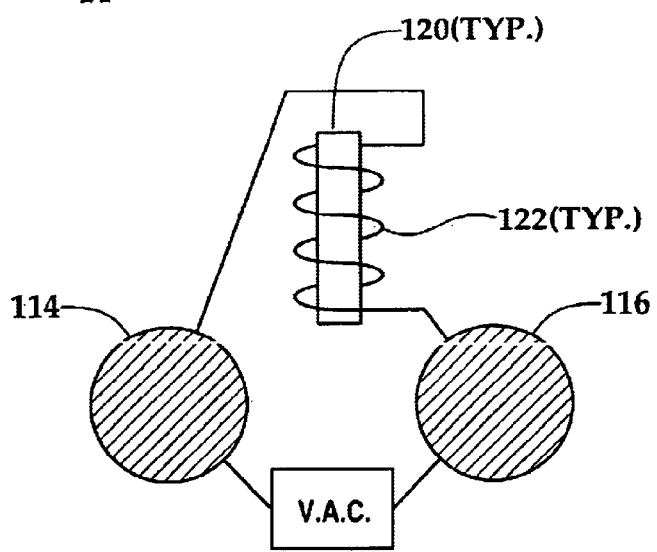
FIG. 10 is an enlarged view of the central portion of the planetary object carriage shown in FIG. 9 and depicting a typical metal vaporization arrangement.
Figure 13:
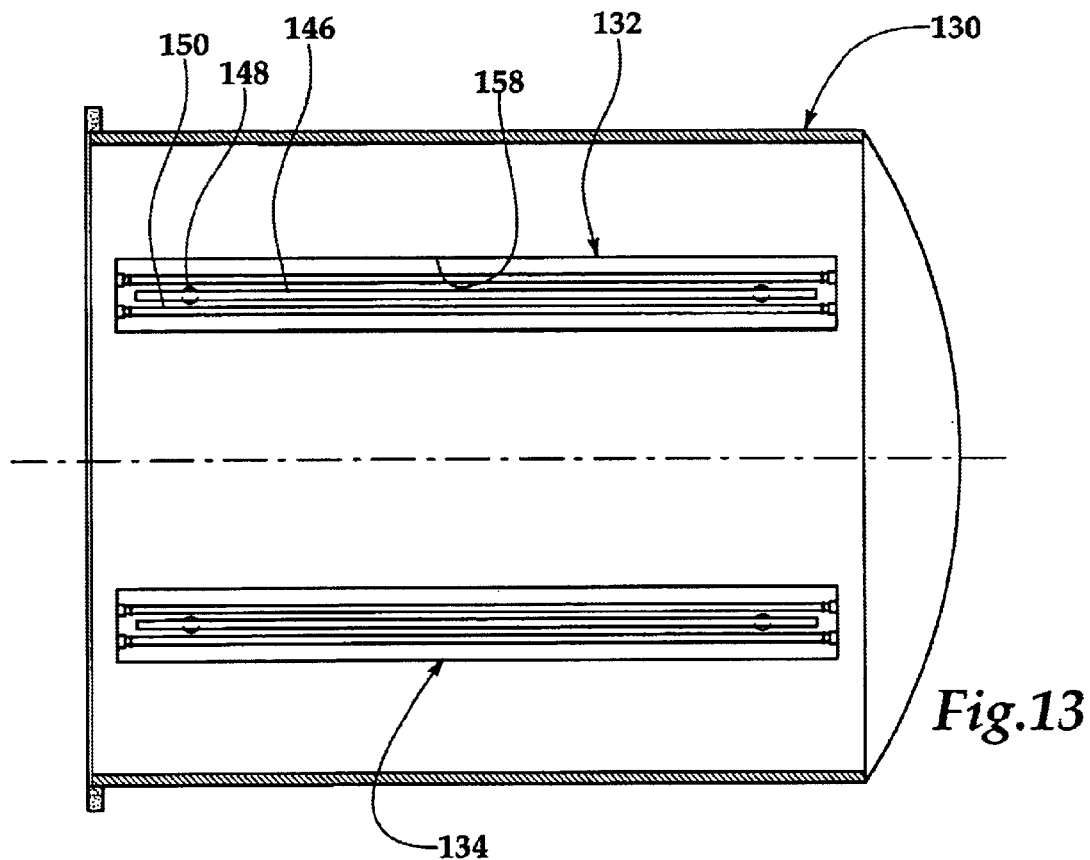
FIG. 13 is a simplified section view in the direction of arrows 13—13 in FIG. 12.

The carriage 66 includes a plurality of apertured reels 74 mounted for rotation on circular frame members 68 and 70, pairs of these reels being interconnected by a longitudinal connecting shaft 72. As best seen in FIG. 5, the circular frames 68 and 70 rotate in the direction of arrow C, while each of the pairs of reels 74 on shaft 77 rotate oppositely in the direction of arrows D as seen in FIG. 9.

By this arrangement, the carriage 66, using both longitudinal shafts 77 and the apertures provided in each of the reels 74 having apparatus 75, will supportively receive objects to be hung therefrom for vacuum deposition of coatings within the vacuum chamber.

The carriage 66 also includes upright supports 82 and 84 which include electrical contacts 88 to supportively receive one or more elongated solid copper conductive bars 114, 116 and 118 as seen in FIGS. 7–10 supported thereon and therebetween. These copper bars shown schematically at 114 and 116 in FIG. 10 serve to carry the current and voltage required to vaporize a plurality of small pieces of sacrificial aluminum canes shown typically at 120 held within tungsten coils 122. Typically, between ten and fifteen of these aluminum sacrificial canes 120 are positioned along the length and between the aluminum rods 114, 116 and 118 as required based upon the volume of vaporized aluminum required to coat all of the objects being hung from the carriage 66.

Upon positioning of the carriage 66 loaded with objects to be coated into the vacuum chamber 12, the ends of the rods 114 and 116 and, where required, a third copper rod 118 as shown in FIG. 11, automatically interconnect with electrode plate 62. By this arrangement, no additional electrical conduit or connectors or the like are required to make full electrical connection between the firing transformer housing 51a and the inductor rods 114, 116 and 118.

Figure 6:
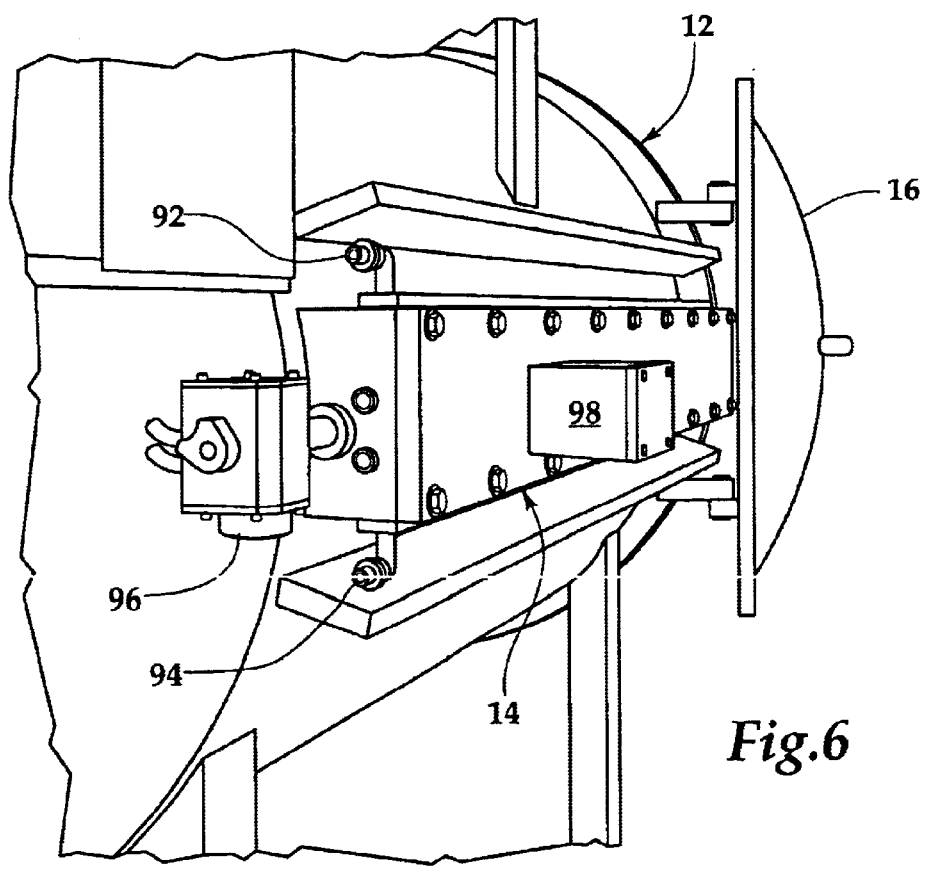
FIG. 6 is a perspective view of a polymerization gun as seen from the exterior of the vacuum chamber.
Figure 7:
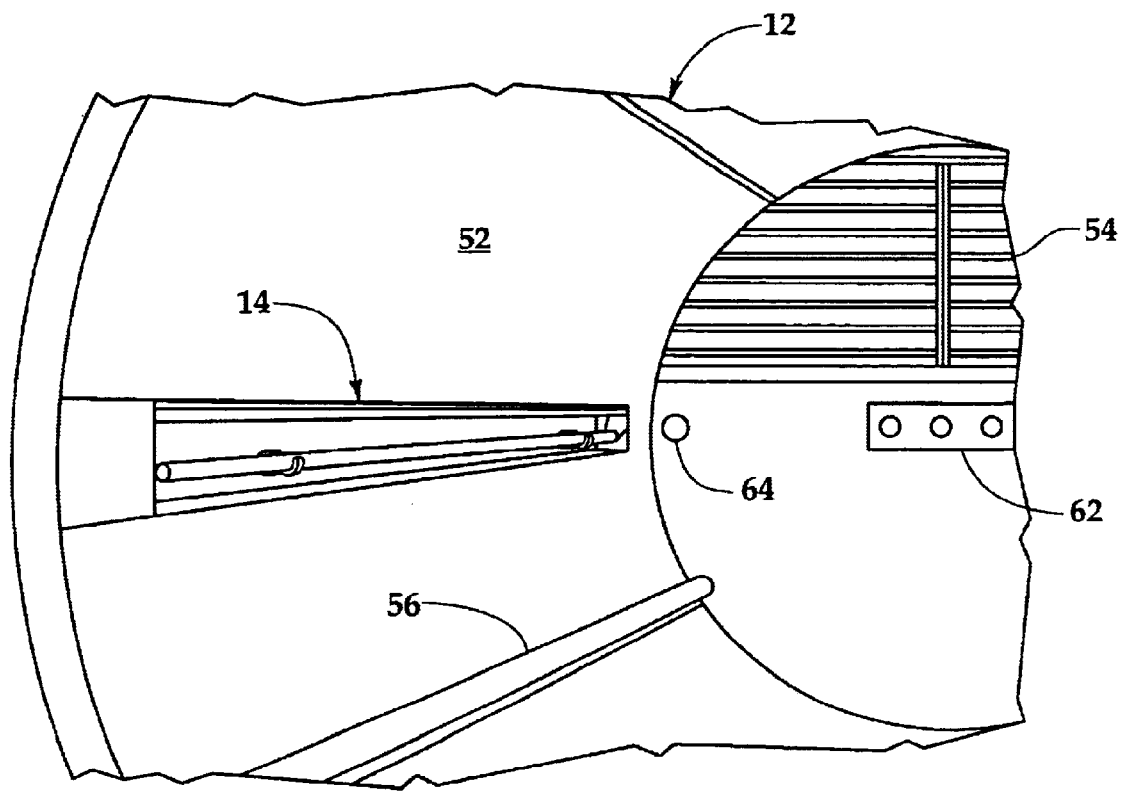
FIG. 7 is a perspective view of the polymerization gun in an open configuration as seen from the interior of the vacuum chamber.
Figure 8:
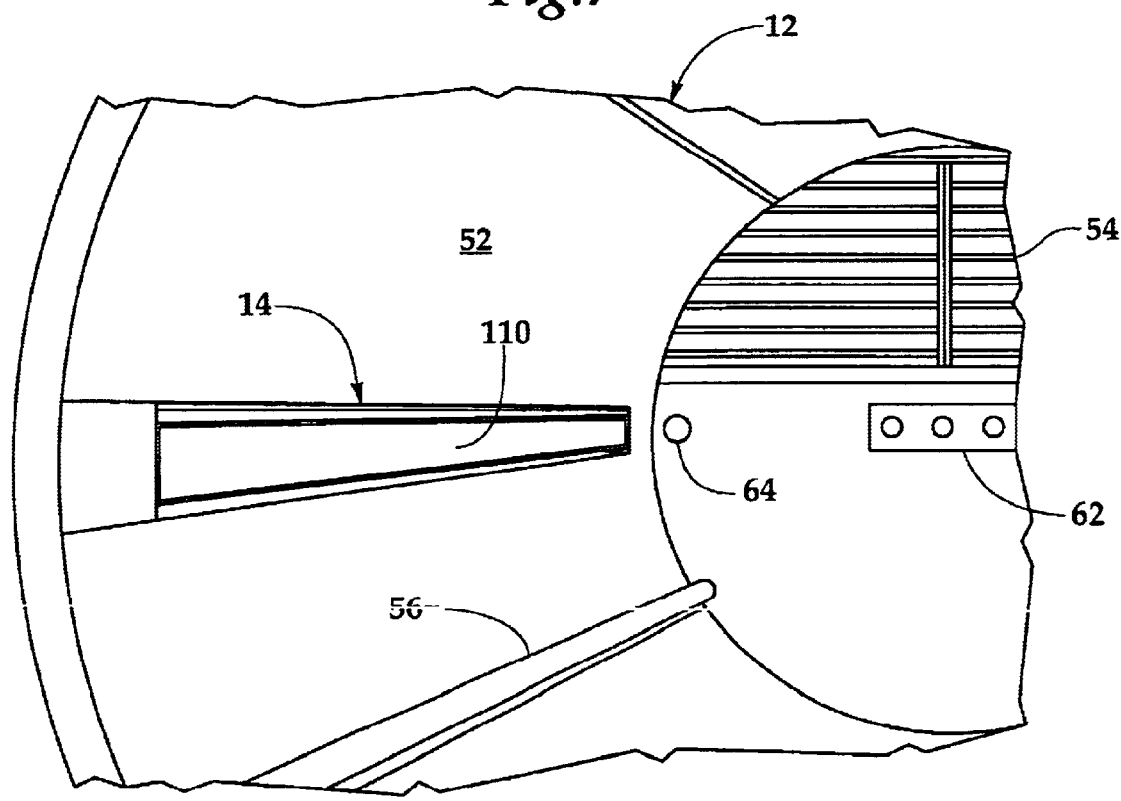
FIG. 8 is a view similar to FIG. 7 with the protective shield of the polymerization gun in a closed position.

A most important feature of the present invention is embodied in the polymerization gun assembly 14. As seen externally in FIG. 6 and from within the vacuum chamber in FIGS. 4 and 7 to 9, the polymerization gun 14 includes an external housing 98 formed of mild steel plate material which is connected externally around an opening 119 formed longitudinally in the side of the vacuum chamber 12. The housing 98, in combination with opening 119, thus form a cavity 99 in FIG. 9 for receiving the active components of the polymerization gun described herebelow.

Within the housing 98 of the polymerization gun 14 are positioned a longitudinally extending 1" diameter aluminum plasma conductor rod 106 supported within spaced conductive supports 108 (typ.) by which, in turn, are in electrical contact with, and supported by, a high current high voltage feedthru fitting 100. The source utilized for this feedthru fitting 100 is CHA Industries of Freemont, Calif. under P/N FT 58009. This feedthru fitting 100 is connected to the back surface of housing 98 as shown in FIG. 9, the insulated conductor 101 connected to a negative voltage source. The vacuum chamber 12 itself is grounded to the positive (+) side of this voltage source.

As best seen in FIG. 9, the cavity 99 is substantially closeable by a longitudinally extending shutter 110 which is movable from a closed position to an open position in the direction of arrows B by a shutter actuator 96. Thus, when shutter 110 is in the closed position shown in FIG. 9, the components within cavity 99 are substantially protected from the vaporized metal atmosphere described herebelow occurring with the vacuum chamber 12. Conductor rod 106 is also preferably wrapped with aluminum foil for added protection.

The polymerization gun 14 also includes two longitudinally extending hollow fluid delivery tubes, a liquid monomer delivery tube 104 and typically an argon gas delivery tube 102. Each of these delivery tubes 102 and 104 include spaced apart apertures or nozzles 103 and 105, for fluid discharge therefrom, the fluid being drawn from the nozzles by the vacuum environment within the vacuum chamber 12 when occurring during each operation cycle.

Importantly note that the plasma rod 106 is positioned closer to the opening 119 than the liquid monomer and argon delivery tubes 104 and 102, respectively. This important relationship is established so that, when the shutter 110 is in the open position, and appropriate voltage and current are applied between the plasma conductor rod 106 and the vacuum chamber 12 itself, the plasma environment created surrounding the plasma rod 106 must first be penetrated by any vapor or gas discharging from either of these delivery tubes 102 or 104 (in proper sequence) before entering into the vacuum chamber itself.

A coating thickness monitor 64 is disposed at the end of the vacuum chamber 12 to monitor and control the uniform thickness of coatings being deposited upon the objects O positioned within the vacuum chamber 12. The preferred coating thickness monitor 64 sensing is supplied by Inficon, XTC-2 thickness controller. Utilizing a quartz crystal to sense the coating deposit rate and thickness, a feedback signal is provided to an external computer circuit to perform a closed loop control function of the evaporation.

Control System

An Allen Bradley SLC 501B microprocessor with analog input module for built-in vacuum gages includes analog input and output computer cards for all components along with a thermocouple card for temperature monitoring of pumps. Allen Bradley Panel View 550 touch screen allows access to all process functions at the touch of the screen. Components are installed into the control panel 40 along with other appropriate control, alarm and warning signals in keeping with the strict stands for this type of system.

Sequence of Operation

The process of the present invention as above described includes three general steps as a preferred method of operation. After the carriage 66 has been loaded with the objects O to be coated and positioned within the vacuum chamber 12, the domed door 16 is sealingly closed and the vacuum pumping arrangement above described is then activated to substantially evacuate the air and water molecules within the vacuum chamber down to a residual air pressure of about $10^{-1}$ to $10^{-2}$ TORR.

Ion Discharge Cleaning

Voltage of approximately 2,000 volts is applied between the aluminum conductive rod 106 and the vacuum chamber 12 itself. This establishes a plasma glow discharge within the chamber 12 which emanates from the conductive rod 106. With the shutter 110 in the open position, a supply of typically argon gas is supplied at 92 in FIG. 6 and drawn into the argon discharge tube which exits into the cavity 99 and passes into the vacuum chamber 12 through the plasma glow surrounding conductive rod 106. The argon is energized and absorbs energy from the plasma glow and the ionized argon is accelerated in all directions within the vacuum chamber 12 to strike the exterior surfaces of the objects O within the vacuum chamber 12 to effect surface ion cleaning. The process lasts approximately seventy seconds.

Evaporation Phase

The vacuum level within the vacuum chamber 12 is reduced to down to a level of $10^{-4}$ to $10^{-6}$ TORR. At this point, a high current, low voltage potential is established between the reflective rods 114, 116 and 118 (optional) of about 15 V @ 3300 amps. This produces a direct resistance heating of the tungsten filaments shown typically at 122 in FIG. 10. The aluminum sacrificial canes 120 (typ.) are thus heated sufficiently to become vaporized at a temperature which significantly exceeds the vapor pressure in the chamber. Heated, metallized aluminum vapor is uniformly deposited onto the ion cleaned exterior surfaces of the objects O. This phase of the operation takes approximately 70 seconds. Note that shutter 110 is in the closed position so as to substantially prevent the vaporized aluminum from entering into cavity 99 and being deposited on any of the above-described components therein. Additionally, aluminum foil wrapping around conductive rod 106 prevents any build-up of the monomer on the conductive rod 106.

Protective Coating

The vacuum chamber 12 is then adjusted in vacuum level back to approximately $10^{-2}$ TORR. The shutter 110 as placed in the open configuration, a high voltage low current potential between the conductive rod 106 and the vacuum chamber 12 is again applied to create a plasma glow emanating from conductive rod 106. A supply of liquid monomer of any siloxane family, but typically hexamethyl disiloxane, to be drawn through feed line 94 in FIG. 6 into the monomer discharge 104 and into cavity 99 as a vapor. This monomer vapor then passes through the plasma glow produced around conductive rod 106, the monomer vapor, being close to the plasma source, is strongly energized and crosslinked and finally deposited and polymerized onto the exterior surfaces of the metallized objects. This third phase of the production cycle lasts about 3 to 6 minutes.

Because the vaporized monomer must first pass through the plasma glow created by conductive rod 106 before entering the chamber 12 and before contact with any of the objects O within the vacuum chamber 12, a significantly more uniform and durable polymerization and protective coating thickness deposited onto the exterior metallized surfaces of the object O is achieved.

Referring again to FIG. 9, for enhanced and even more uniform deposit of polymerized monomer protective coating onto the exterior metallized surfaces of the objects O, two polymerization guns 14 (shown in phantom), spaced apart 30 degrees about the central longitudinal axis of the vacuum chamber 12 are preferred. This orientation may also substantially equal to the angular spacing between adjacent reels 74 (typ.). Timing of rotation is such that, as all of the reels 74 are rotated as a unit in the direction of arrow C, while each reel 74 rotates approximately through 180 degrees in the direction of arrow D as it passes each of the two spaced polymerization guns 14. By this arrangement, objects hung on each of the reels 74 are exposed to a full revolution of monomer vapor emanating from each of the polymerization guns 14 as previously described. Referring now to FIGS. 11 to 14, the preferred embodiment of the vacuum chamber is shown generally at numeral 130 having a rear end panel 144 and the improved preferred embodiment of each polymerization gun is shown generally at numerals 132 and 134. The previously referenced alternate orientation of dual polymerization guns described and shown in phantom in FIG. 11 has proven to be a more efficient arrangement.

Each polymerization gun assembly 132 and 134 includes external cooling tubes 140 and 142 as seen in FIG. 11. However, in this embodiment of the polymerization gun assemblies 132 and 134, the housing 154 as best seen in FIG. 14, has an arcuately shaped interior surface 156, the housing 154 preferably being made from a split 8" nominal diameter carbon steel pipe which is connected to a matching elongated rectangular opening 158 formed into the chamber wall for each polymerization gun assembly 132 and 134.

A high current-high voltage feed thru fitting 100 as previously described is connected centrally to the back surface of housing 154 with the insulating conductor 101 again being connected to a negative voltage source. Each of the feed thru fittings 100 is protectively housed within metal housing 136 and 138.

Figure 14:
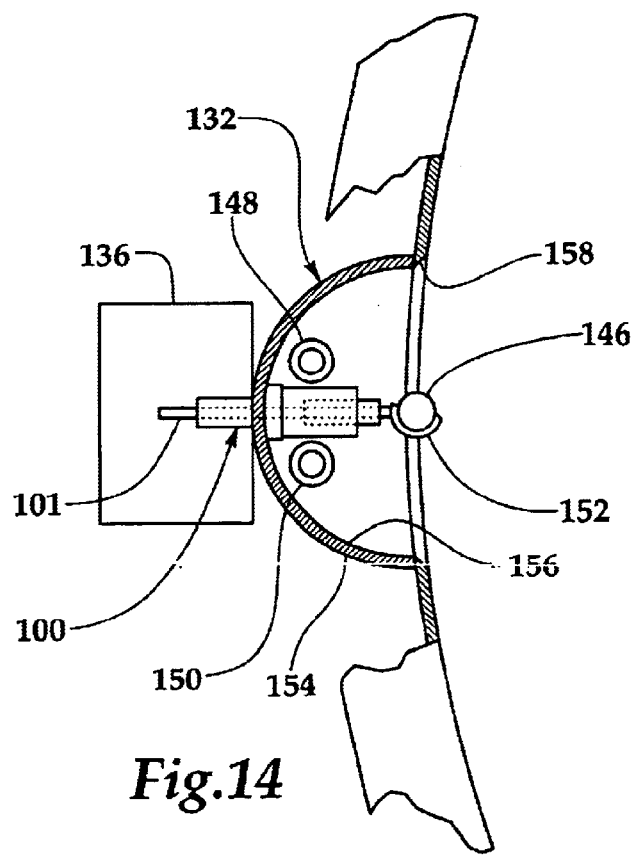
FIG. 14 is an enlarged view of area A of FIG. 12.

Each of the polymerization gun assemblies 132 and 134, as best seen in FIG. 14, include an elongated conductive plasma rod 146 which is formed of a length of 1" diameter aluminum rod supported by conductive supports 152 of each of the feed thru fittings 100. In this embodiment 132 and 134, the plasma rods 146 are positioned with their longitudinal axes generally tangentially oriented with respect to the cylindrical inner surface of the vacuum chamber. By this dual polymerization gun arrangement as best seen in FIG. 14, each of the polymerization rods 146 are in line of sight one to another as shown in the direction of broken line B. This arrangement appears to afford increased polymerization and efficiency of operation when each assembly 132 and 134 are radially spaced apart at ±19° (about 38° total). This radial angular separation may be in the range of about ±10° to 45°.

Each of the polymerization gun assemblies 132 and 134 include a background gas, preferably argon gas, elongated distribution tube 148 and an elongated liquid monomer vapor distribution tube 150 positioned within the housing 154 as shown. Each of these elongated tubes 148 and 150 have a nominal inside diameter of 3/8" with distribution apertures or nozzles having a nominal diameter of 0.06" and evenly spaced at 1" apart and function as previously described.

The previously described shutter for each of the plasma gun assemblies 132 and 134 appears not to be necessary. Thus, this assembly sees an alternative of the positive layers whereby the dielectric layer remains small.

Although the preferred embodiment of the housing 154 thus includes a cylindrical inner surface 156 of a semicircular nature, other substantially continuous arcuate inner surfaces as a substitute therefor are within the intended scope of this invention.

Figure 17:
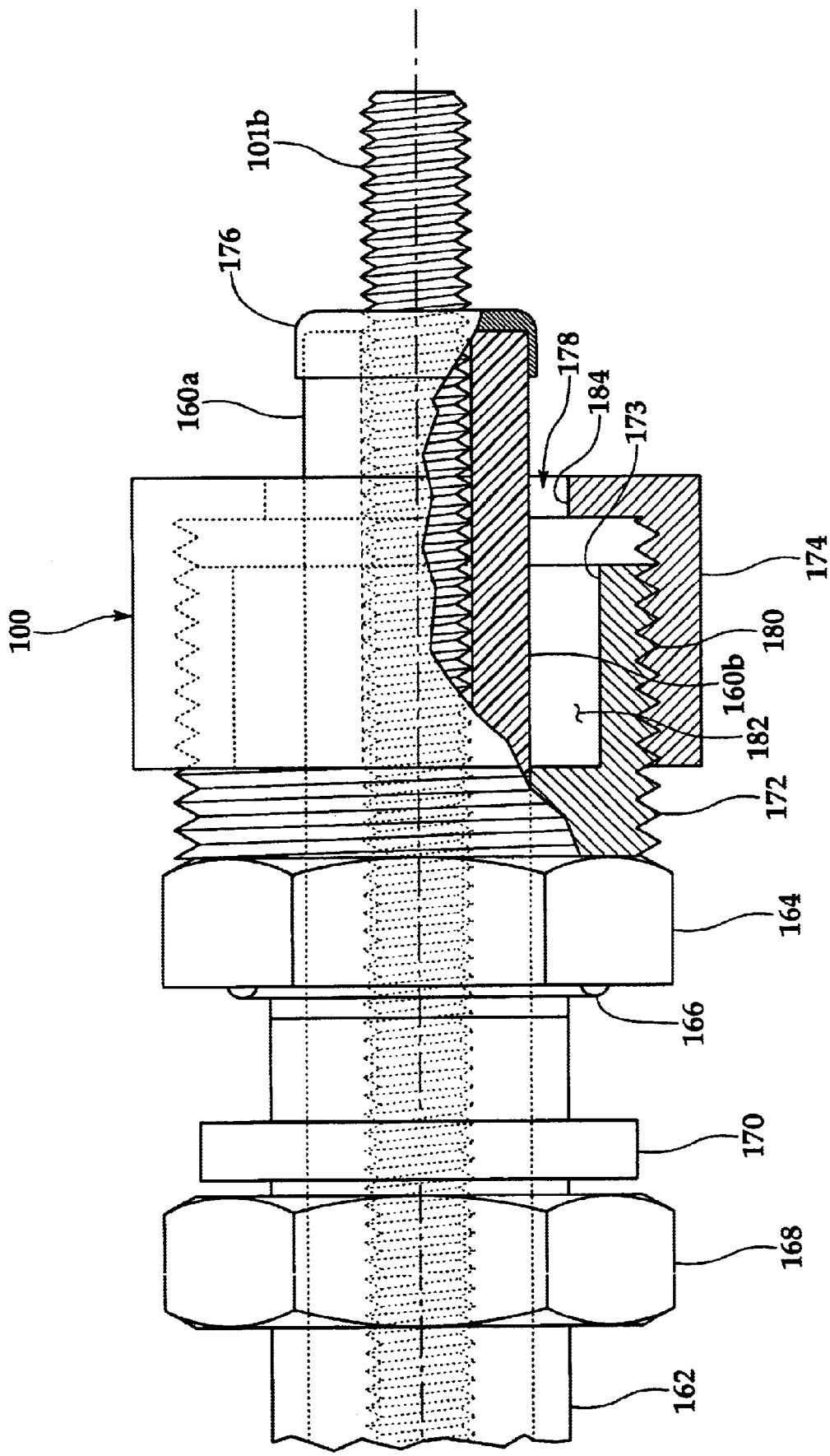
FIG. 17 is an enlarged broken view of the inner portion of the feedthru fitting of FIG. 15.

Referring now to FIGS. 15, 16 and 17, an improved anti-fouling arc-resistant feedthru fitting or electrode is there shown generally at numeral 100. As previously described, the feedthru fitting 100 is connected to the back wall of the polymerization gun housing 98 with the outer portion 101a of the elongated threaded conductor 101 being positioned outside of the chamber 12 and housing 98 for connection to the high voltage, high current power supply.

The fitting 100 includes an elongated case 172 having an elongated threaded portion 162 which passes through a mating opening in the housing 98 and is there secured as best seen in FIGS. 9 and 15 by a lock jam nut 168 tightened against a washer 170 against the outer surface of the housing 98 by the jam nut 168. An o-ring 166 bears against the inner surface of the wall of the housing 98 which is positioned in an annular groove in hex nut 164. Thus, the hex nut 164 and threaded portion 172 are positioned on the interior of the vacuum chamber and thus exposed to the vapor deposition conditions within the chamber.

An elongated non-conductive ceramic sleeve 160 coaxially extends over the elongated threaded conductor 101 but terminates short of each end 101a and 101b of the conductor 101. A metal cap 176 connected to the conductor 101 establishes a longitudinal spacing between the conductor 101 and the corresponding end 160a of the ceramic non-conductor 160.

An annular-shaped gap 182 exists between the inner cylindrical surface 173 of the case 172 and the outer surface 160b of the non-conductive ceramic sleeve 160. This cavity 182 is sufficiently large in radial thickness to absorb a reasonable amount of conductive vapor which is typically deposited thereon during the successive vacuum cycles of the apparatus 10 and finally caused to flake off or build in thickness sufficiently to cause arcing. Thus, this first gap 182 of an annular shape, is sufficiently thick in radial dimension for the vapor deposition material to pass through and attach to the non-conductive surface 160.

The improved anti-fouling and arc-resistant aspect of this feedthru fitting is in the form of a removable cup 174 which threadably engages at mating threads 180 onto the threaded outer surface of case 172. The cup 174 includes an aperture 184 which is coaxial with and sized for passing the ceramic non-conductive sleeve 160 therethrough and establishing a smaller second annular gap 178 which is sufficienty small to inhibit or prevent the vapor deposition material from entering into the larger gap 182 through the second gap 178.

Thus, by this arrangement, the vapor deposition metal cannot enter into the first gap 182 because the second gap 178 has been found to be sufficiently small in radial dimension to prevent the same from happening. This gap 178 is preferably in the range of no more than 1/8" in radial thickness dimension. Any metal deposits may be routinely cleaned by simply removing the protective cup 174 and replacing it with a clean one after which the metal coating may be removed.

While the instant invention has been shown and described herein in what are conceived to be the most practical and preferred embodiments, it is recognized that departures may be made therefrom within the scope of the invention, which is therefore not to be limited to the details disclosed herein, but is to be afforded the full scope of the claims so as to embrace any and all equivalent apparatus and articles.

What is claimed is:

1. An elongated feedthru electric power transfer fitting for conveying high voltage and electric current through a conductive wall of a vacuum deposition chamber comprising:

an elongated tubular case having an inner and an outer portion and adapted for rigid connection through, and extending in either direction from, an aperture formed through the wall;

an elongated cylindrical conductive central electrode extending coaxially within and beyond each end of said case;

a non-conductive cylindrical isolator extending radially between said central electrode and said case, said isolator extending beyond the ends of said case but not to the ends of said central electrode whereby the ends of said central electrode are exposed for electrical engagement at one of said ends with an electric power source exterior to the chamber and at the other of said ends with a support for a conductive plasma rod positioned in the chamber;

said inner portion of said case positioned within the chamber and spaced radially outwardly from an outer surface of said isolator a distance defining a first annular gap;

a removable protective cap engagable over an outer surface of the inner portion of said case with an inner end portion of said isolator extending though an aperture formed through a bottom of said cap;

the outer surface of said isolator and the aperture in said cap bottom defining a second annular gap which is smaller in radial width than that of said first gap, said second gap sufficiently small to prevent vaporized metal in the chamber from passing therethrough to otherwise deposit onto the outer surface of said isolator within said first gap.

2. A polymerization gun for a vacuum chamber of an apparatus for protectively coating objects by vacuum deposition, said polymerization gun comprising:

an elongated housing connectable onto an outer surface of, and opening into, said chamber and sealably connected over an elongated opening formed through a side wall of said vacuum chamber;

an elongated conductive bar supported in and generally coextensive with said housing, said conductive bar being electrically isolated from said chamber and said housing;

an elongated monomer delivery member also supported in said housing having spaced monomer dispensing apertures and being spaced in close proximity to said conductive bar;

said monomer delivery member being connectable with an external supply of a liquid monomer or polymer, said conductive bar being positioned between said monomer or polymer delivery member and said opening and in close proximity to said conductive bar whereby substantially all of the vapor monomer or polymer being drawn by a vacuum environment into said chamber must first pass through and be energized and ionized by a plasma before being deposited and polymerized to form said protective coating;

an elongated tubular case having an inner and an outer portion and adapted for rigid connection through, and extending in either direction from, an aperture formed through the wall;

an elongated cylindrical conductive central electrode extending coaxially within and beyond each end of said case;

a non-conductive cylindrical isolator extending radially between said central electrode and said case, said isolator extending beyond the ends of said case but not to the ends of said central electrode whereby the ends of said central electrode are exposed for electrical engagement at one of said ends with an electric power source exterior to the chamber and at the other of said ends with a support for a conductive plasma rod positioned in the chamber;

said inner portion of said case positioned within the chamber and spaced radially outwardly from an outer surface of said isolator a distance defining a first annular gap;

a removable protective cap engagable over an outer surface of the inner portion of said case with an inner end portion of said isolator extending through an aperture formed through a bottom of said cap;

the outer surface of said isolator and the aperture in said cap bottom defining a second annular gap which is smaller in radial width than that of said first gap, said second gap sufficiently small to prevent vaporized metal in the chamber from passing therethrough to otherwise deposit on the outer surface of the inner portion of said isolator within said first gap;

said plasma being produced by applying a suitable current high electric potential between said conductive bar and said chamber by said feedthru fitting.

3. An apparatus for applying a uniform metal coating onto objects followed by a uniform protective coating atop the metal coating, said apparatus comprising:

a vacuum chamber including an elongated cavity formed into a side wall of said chamber;

said cavity substantially hollow and opening into said chamber;

means for establishing a vacuum in said chamber;

means for supporting the objects within said chamber;

means for depositing a uniform metal vapor onto the objects;

a polymerizer gun positioned and connected substantially within said cavity including an elongated conductive bar supported and electrically isolated from said chamber by a feedthru fitting and an elongated monomer delivery member having spaced monomer dispensing apertures, said delivery member being spaced in close proximity to said conductive bar;

an elongated tubular case having an inner and an outer portion and adapted for rigid connection through, and extending in either direction from, an aperture formed through the wall;

an elongated cylindrical conductive central electrode extending coaxially within and beyond each end of said case;

a non-conductive cylindrical isolator extending radially between said central electrode and said case, said isolator extending beyond the ends of said case but not to the ends of said central electrode whereby the ends of said central electrode are exposed for electrical engagement at one of said ends with an electric power source exterior to the chamber and at the other of said ends with a support for a conductive plasma rod positioned in the chamber;

said inner portion of said case positioned within the chamber and spaced radially outwardly from an outer surface of said isolator a distance defining a first annular gap;

a removable protective cap engagable over an outer surface of the inner portion of said case with an inner end portion of said isolator extending through an aperture formed through a bottom of said cap;

the outer surface of said isolator and the aperture in said cap bottom defining a second annular gap which is smaller in radial width than that of said first gap, said second gap sufficiently small to prevent vaporized metal in the chamber from passing therethrough to otherwise deposit on the inner portion of said isolator within said first gap;

said delivery member being in fluid communication with an external supply of a liquid monomer, said conductive bar being positioned between said delivery member and an opening of said cavity into said chamber whereby substantially all of said liquid monomer being drawn by vacuum into said chamber through said delivery member must first pass through a plasma produced by applying suitable direct current high electric potential between said conductive bar as a cathode and said chamber as an anode through said feedthru fitting before being uniformly deposited and polymerized to form said protective coating.

4. In an apparatus for applying a uniform metal coating onto objects followed by a uniform protective coating atop said metal coating, said apparatus including a vacuum chamber including an elongated cavity formed into a side wall of said chamber, means for establishing a vacuum in said chamber, means for supporting the objects within said chamber, means for depositing a uniform metal vapor onto the objects, a polymerization gun positioned and connected substantially within said cavity including an elongated conductive bar electrically isolated from said chamber and an elongated monomer delivery member having spaced monomer dispensing apertures, said delivery member being spaced in close proximity to said conductive bar, said delivery member being in fluid communication with an external supply of a liquid monomer, said conductive bar being positioned between said delivery member and an opening of said cavity into said chamber whereby substantially all of said liquid monomer being drawn by vacuum into said chamber through said delivery member must first pass through a plasma produced by applying suitable direct current high electric potential between said conductive bar as a cathode and said chamber as an anode before being uniformly deposited and polymerized to form said protective coating, the improvement, an elongated feedthru electric power transfer fitting comprising:

an elongated tubular case having an inner and an outer portion and adapted for rigid connection through, and extending in either direction from, an aperture formed through the wall;

an elongated cylindrical conductive central electrode extending coaxially within and beyond each end of said case;

a non-conductive cylindrical isolator extending radially between said central electrode and said case, said isolator extending beyond the ends of said case but not to the ends of said central electrode whereby the ends of said central electrode are exposed for electrical engagement at one of said ends with an electric power source exterior to the chamber and at the other of said ends with a support for a conductive plasma rod positioned in the chamber;

said inner portion of said case positioned within the chamber and spaced radially outwardly from an outer surface of said isolator a distance defining a first annular gap;

a removable protective cap engagable over an outer surface of the inner portion of said case with an inner end portion of said isolator extending through an aperture formed through a bottom of said cap;

the outer surface of said isolator and the aperture in said cap bottom defining a second annular gap which is smaller in radial width than that of said first gap, said second gap sufficienty small to prevent vaporized metal in the chamber from passing therethrough to otherwise deposit on the outer surface of the inner portion of said isolator within said first gap.

5. In an apparatus for coating objects by vacuum deposition including:

a vacuum chamber including an elongated cavity in vacuum communication with, and opening into, said chamber through an elongated opening formed through a side wall of said chamber;

means for establishing a vacuum in said chamber;

means for supporting the objects within said chamber;

means for vaporizing a metal within said chamber when under vacuum for deposit onto substantially all exposed surfaces of the objects;

an elongated conductive rod positioned in said cavity for producing a plasma and means for dispensing a liquid monomer which is drawn by chamber vacuum from an external supply as a vapor into said chamber whereby substantially all of said monomer vapor is directed to pass through said plasma before being uniformly deposited and polymerized atop the exposed surfaces of the objects which have previously been coated with a vaporized method, the improvement comprising:

an elongated tubular case having an inner and an outer portion and adapted for rigid connection through, and extending in either direction from, an aperture formed through the wall;

an elongated cylindrical conductive central electrode extending coaxially within and beyond each end of said case;

a non-conductive cylindrical isolator extending radially between said central electrode and said case, said isolator extending beyond the ends of said case but not to the ends of said central electrode whereby the ends of said central electrode are exposed for electrical engagement at one of said ends with an electric power source exterior to the chamber and at the other of said ends with a support for a conductive plasma rod positioned in the chamber;

said inner portion of said case positioned within the chamber and spaced radially outwardly from said isolator a distance defining a first annular gap;

a removable protective cap engagable over an outer surface of the inner portion of said case with an inner end portion of said isolator extending through an aperture formed through a bottom of said cap;

the outer surface of said isolator and the aperture in said cap bottom defining a second annular gap which is smaller in radial width than that of said first gap, said second gap sufficiently small to prevent vaporized metal in the chamber from passing therethrough to otherwise deposit onto the outer surface of the inner portion of said isolator within said first gap.

* * * * *